US010008288B2

(12) United States Patent
Lee

(10) Patent No.: US 10,008,288 B2
(45) Date of Patent: Jun. 26, 2018

(54) POWER LOSS TEST DEVICE AND METHOD FOR NONVOLATILE MEMORY DEVICE

(71) Applicant: Elixir Flash Technology Co., Ltd., Seongnam-si (KR)

(72) Inventor: Sung-woo Lee, Seongnam-si (KR)

(73) Assignee: Elixir Flash Technology Co., Ltd., Seongnam-si (KR)

(*) Notice: Subject to any disclaimer, the term of this patent is extended or adjusted under 35 U.S.C. 154(b) by 277 days.

(21) Appl. No.: 14/783,132

(22) PCT Filed: Jul. 24, 2013

(86) PCT No.: PCT/KR2013/006612
§ 371 (c)(1),
(2) Date: Nov. 23, 2015

(87) PCT Pub. No.: WO2014/168295
PCT Pub. Date: Oct. 16, 2014

(65) Prior Publication Data
US 2016/0078967 A1    Mar. 17, 2016

(30) Foreign Application Priority Data
Apr. 8, 2013    (KR) .................. 10-2013-0038226

(51) Int. Cl.
*G11C 29/50*    (2006.01)
*G11C 29/04*    (2006.01)
*G11C 16/30*    (2006.01)

(52) U.S. Cl.
CPC ............. *G11C 29/50* (2013.01); *G11C 29/04* (2013.01); *G11C 16/30* (2013.01); *G11C 2029/5002* (2013.01); *G11C 2029/5006* (2013.01)

(58) Field of Classification Search
CPC ............ G11C 16/30; G11C 2029/5002; G11C 2029/5006; G11C 29/04; G11C 29/50
See application file for complete search history.

(56) References Cited

U.S. PATENT DOCUMENTS 6,301,167 B1 * 10/2001 Lee, III .................. G11C 29/56
365/201
7,039,780 B2 * 5/2006 Taussig .................... G11C 7/16
348/207.99
(Continued)

FOREIGN PATENT DOCUMENTS

| JP | 2007-256264 A | 10/2007 |
| JP | 2009-514088 A | 4/2009 |
| JP | 2009-289334 A | 12/2009 |

OTHER PUBLICATIONS

International Search Report and Written Opinion, PCT/KR2013/006612, dated Jan. 17, 2014, including English translation of Search Report only, 8 pages.

*Primary Examiner* — Terrell S Johnson
(74) *Attorney, Agent, or Firm* — Daly, Crowley, Mofford & Durkee, LLP

(57) ABSTRACT

A power loss test apparatus for a non-volatile memory device includes a test-board including at least one socket into which at least one test target non-volatile memory device is inserted, a micro controller that determines whether to supply power to the test target non-volatile memory device based on current consumption information or operating state information of the test target non-volatile memory device, and a tester that performs a power loss test for the test target non-volatile memory device based on whether the power is supplied to the test target non-volatile memory device.

15 Claims, 9 Drawing Sheets

(56) References Cited

U.S. PATENT DOCUMENTS

2005/0108491 A1* 5/2005 Wong ............... G11C 29/50004
                                                    711/167
2007/0096709 A1   5/2007 Brown
2008/0089161 A1   4/2008 Wong et al.

* cited by examiner

POWER LOSS TEST DEVICE AND METHOD FOR NONVOLATILE MEMORY DEVICE

CROSS REFERENCE TO RELATED APPLICATIONS

This application is a U.S. National Stage of PCT application PCT/KR2013/006612 filed in the Korean language on Jul. 24, 2013, entitled "POWER LOSS TEST DEVICE AND METHOD FOR NONVOLATILE MEMORY DEVICE," which claims priority to Korean application 10-2013-0038226, filed on Apr. 8, 2013, which applications are each hereby incorporated herein by reference in their entireties.

BACKGROUND

1. Technical Field

Example embodiments relate generally to a semiconductor memory device. More particularly, embodiments of the present inventive concept relate to a power loss test technique for a non-volatile memory device (e.g., a flash memory device, etc).

2. Description of the Related Art

A semiconductor memory device may be classified into two types (i.e., a volatile memory device and a non-volatile memory device) according to whether data can be retained when power is not supplied. Recently, a NAND flash memory device is widely used as the non-volatile memory device because the NAND flash memory device can be manufactured smaller in size while having higher capacity. Thus, a storage device including the NAND flash memory device (e.g., an embedded multi media card (eMMC), a solid state drive (SSD), etc) has been replacing a hard disk drive (HDD). Generally, the NAND flash memory device includes at least one NAND flash memory and a memory controller that controls the NAND flash memory. Specifically, the memory controller performs an address mapping operation based on a flash translation layer (FTL) for supporting a file system. In addition, the memory controller controls, for the NAND flash memory, a read operation, a write operation, an erase operation, a merge operation, a copy-back operation, a compaction operation, a garbage collection operation, a wear leveling operation, and the like.

As described above, many operations, which a host device does not recognize, are performed in the non-volatile memory device. Thus, if a sudden power-off occurs (i.e., if power supplied to the non-volatile memory device is suddenly cut off while the non-volatile memory device performs the write operation or the garbage collection operation), data and/or meta-data related thereto may be lost, so that an error (i.e., a malfunction) of the non-volatile memory device may be caused. Accordingly, in order to achieve reliability-in use, the non-volatile memory device is required to prevent the error due to losses of the data and/or the meta-data by performing a data recovery operation when the sudden power-off occurs. Typically, a reliability-in use-test responding to the sudden power-off (i.e., referred to as a power loss test) is performed for the non-volatile memory device before shipping the non-volatile memory device. A conventional test technique checks whether an error due to losses of data and/or meta-data related thereto occurs by randomly cutting off power supplied to a non-volatile memory device while the non-volatile memory device performs a write operation. However, since the conventional test technique randomly cuts off the power while the non-volatile memory device performs the write operation, the conventional test technique cannot consider an internal operating state of the non-volatile memory device. In other words, the conventional test technique inefficiently performs the power loss test.

SUMMARY

Some example embodiments provide a power loss test apparatus for a non-volatile memory device that can efficiently perform a power loss test by cutting off power supplied to the non-volatile memory device only during important operations of the non-volatile memory device by considering an internal operating state of the non-volatile memory device.

Some example embodiments provide a method of performing a power loss test for a non-volatile memory device that can efficiently perform the power loss test by cutting off power supplied to the non-volatile memory device only during important operations of the non-volatile memory device by considering an internal operating state of the non-volatile memory device.

According to an aspect of example embodiments, a power loss test apparatus for a non-volatile memory device according to example embodiments may include a test-board including at least one socket into which at least one test target non-volatile memory device is inserted, a micro controller configured to determine whether to supply power to the test target non-volatile memory device based on current consumption information or operating state information of the test target non-volatile memory device, and a tester configured to perform a power loss test for the test target non-volatile memory device based on whether the power is supplied to the test target non-volatile memory device.

In example embodiments, the test target non-volatile memory device may constitute an embedded multi media card.

In example embodiments, the micro controller may be included in the test-board or in the tester.

In example embodiments, the test-board may include a current monitoring module configured to monitor current consumption of the test target non-volatile memory device to generate the current consumption information, and a power control module configured to supply the power to the test target non-volatile memory device through the socket when the micro controller determines to supply the power to the test target non-volatile memory device and configured to cut off the power from the test target non-volatile memory device through the socket when the micro controller determines not to supply the power to the test target non-volatile memory device.

In example embodiments, the micro controller may analyze a current consumption pattern of the test target non-volatile memory device based on the current consumption information. In addition, the micro controller may cut off the power from the test target non-volatile memory device when the current consumption pattern indicates a power cut-off execution period.

In example embodiments, the test-board may include a state monitoring module configured to monitor at least one state register that indicates whether performing a garbage collection operation is required for the test target non-volatile memory device to generate the operating state information, and a power control module configured to supply the power to the test target non-volatile memory device through the socket when the micro controller determines to supply the power to the test target non-volatile memory device and configured to cut off the power from the test target non-volatile memory device through the socket when the micro controller determines not to supply the power to the test target non-volatile memory device.

In example embodiments, the micro controller may anticipate a garbage collection period during which the test target non-volatile memory device performs the garbage collection operation based on the operating state information. In addition, the micro controller may cut off the power from the test target non-volatile memory device during the anticipated garbage collection period.

In example embodiments, the test-board may include a current monitoring module configured to monitor current consumption of the test target non-volatile memory device to generate the current consumption information, a state monitoring module configured to monitor at least one state register that indicates whether performing a garbage collection operation is required for the test target non-volatile memory device to generate the operating state information, and a power control module configured to supply the power to the test target non-volatile memory device through the socket when the micro controller determines to supply the power to the test target non-volatile memory device and configured to cut off the power from the test target non-volatile memory device through the socket when the micro controller determines not to supply the power to the test target non-volatile memory device.

In example embodiments, the test-board may further include a memory module configured to store the current consumption information and the operating state information.

In example embodiments, the micro controller may anticipate a garbage collection period during which the test target non-volatile memory device performs the garbage collection operation based on the operating state information and may analyze a current consumption pattern of the test target non-volatile memory device based on the current consumption information. In addition, the micro controller may cut off the power from the test target non-volatile memory device when the current consumption pattern indicates a power cut-off execution period during the anticipated garbage collection period.

According to an aspect of example embodiments, a method of performing a power loss test for a non-volatile memory device according to example embodiments may include an operation of generating, at a test-board connected to at least one test target non-volatile memory device, current consumption information or operating state information of the test target non-volatile memory device, an operation of determining, at a micro controller, whether to supply power to the test target non-volatile memory device based on the current consumption information or the operating state information, and an operation of performing, at a tester, the power loss test for the test target non-volatile memory device based on whether the power is supplied to the test target non-volatile memory device.

In example embodiments, the test target non-volatile memory device may constitute an embedded multi media card.

In example embodiments, the current consumption information may be generated by monitoring current consumption of the test target non-volatile memory device, and a current consumption pattern of the test target non-volatile memory device may be analyzed based on the current consumption information. In addition, the power may be cut off from the test target non-volatile memory device when the current consumption pattern indicates a power cut-off execution period.

In example embodiments, the operating state information may be generated by monitoring at least one state register that indicates whether performing a garbage collection operation is required for the test target non-volatile memory device, and a garbage collection period during which the test target non-volatile memory device performs the garbage collection operation may be anticipated based on the operating state information. In addition, the power may be cut off from the test target non-volatile memory device during the anticipated garbage collection period.

In example embodiments, the current consumption information may be generated by monitoring current consumption of the test target non-volatile memory device, and the operating state information may be generated by monitoring at least one state register that indicates whether performing a garbage collection operation is required for the test target non-volatile memory device. In addition, a garbage collection period during which the test target non-volatile memory device performs the garbage collection operation may be anticipated based on the operating state information, and a current consumption pattern of the test target non-volatile memory device may be analyzed based on the current consumption information. Further, the power may be cut off from the test target non-volatile memory device when the current consumption pattern indicates a power cut-off execution period during the anticipated garbage collection period.

Therefore, a power loss test apparatus for a non-volatile memory device according to example embodiments may efficiently perform a power loss test by cutting off power supplied to the non-volatile memory device only during important operations (e.g., a garbage collection operation, etc) of the non-volatile memory device based on current consumption information and/or operating state information of the non-volatile memory device. Thus, a run-time of the power loss test may be reduced and coverage of the power lost test may be enlarged. As a result, productivity of manufacturers and reliability-in use of final products may be improved.

In addition, a method of performing a power loss test for a non-volatile memory device according to example embodiments may efficiently perform the power loss test by cutting off power supplied to the non-volatile memory device only during important operations (e.g., a garbage collection operation, etc) of the non-volatile memory device based on current consumption information and/or operating state information of the non-volatile memory device. Thus, a run-time of the power loss test may be reduced and coverage of the power lost test may be enlarged. As a result, productivity of manufacturers and reliability-in use of final products may be improved.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
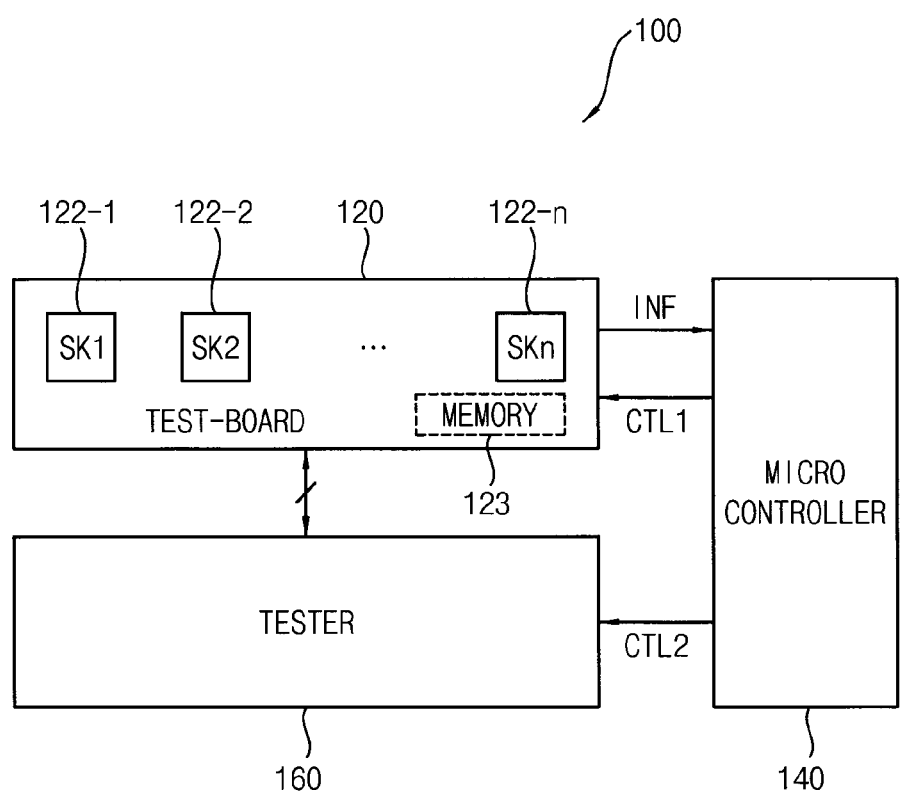
FIG. 1 is a block diagram illustrating a power loss test apparatus for a non-volatile memory device according to example embodiments.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
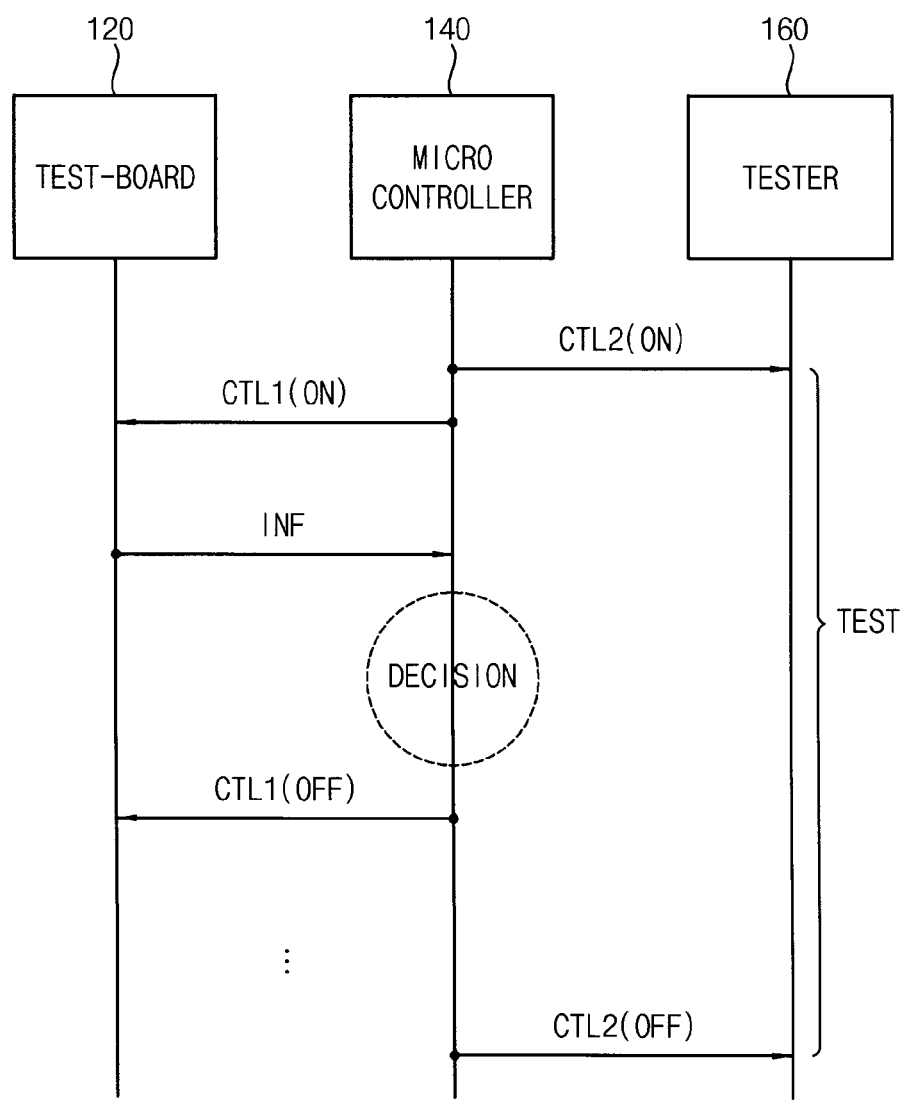
FIG. 2 is a diagram illustrating an example in which a test-board, a micro controller, and a tester operate in the power loss test apparatus of FIG. 1.

FIG. 1 is a block diagram illustrating a power loss test apparatus for a non-volatile memory device according to example embodiments. FIG. 2 is a diagram illustrating an example in which a test-board, a micro controller, and a tester operate in the power loss test apparatus of FIG. 1.

Referring to FIGS. 1 and 2, the power loss test apparatus 100 for the non-volatile memory device may include a test-board 120, a micro controller 140, and a tester 160. Here, the non-volatile memory device may constitute an embedded multi media card (eMMC). However, the non-volatile memory device is not limited thereto. For example, the non-volatile memory device may constitute a secure digital (SD) card, a compact flash (CF) card, a memory stick, an XD picture card, and the like.

The test-board 120 may include at least one socket 122-1 through 122-n into which at least one test target non-volatile memory device is inserted, where n is an integer greater than or equal to 1. Generally, if a sudden power-off occurs (i.e., if power supplied to a non-volatile memory device is suddenly cut off while the non-volatile memory device performs a write operation or a garbage collection operation), data and/or meta-data related thereto may be lost, so that an error (i.e., a malfunction) of the non-volatile memory device may be caused. Thus, the power loss test apparatus 100 may perform a power loss test to check whether the non-volatile memory device can prevent the error due to losses of the data and/or the meta-data by performing a data recovery operation when the sudden power-off occurs. Here, when the test-board 120 includes a plurality of sockets 122-1 through 122-n, a plurality of test target non-volatile memory devices may be inserted into the sockets 122-1 through 122-n, respectively. Thus, since the power loss test apparatus 100 concurrently (or, simultaneously) performs the power loss test for the test target non-volatile memory devices, the power loss test may be efficiently performed at high speed. For example, as illustrated in FIG. 2, the tester 160 may perform the power loss test for the test target non-volatile memory device inserted into the socket 122-1 through 122-n of the test-board 120 during a period between a time when the tester 160 receives a second control signal CTL2(ON) that controls the tester 160 to start the power loss test from the micro controller 140 and a time when the tester 160 receives a second control signal CTL2(OFF) that controls the tester 160 to end the power loss test from the micro controller 140.

The micro controller 140 may determine whether to supply power to the test target non-volatile memory device based on current consumption information or operating state information of the test target non-volatile memory device. A conventional power loss test apparatus checks whether an error due to losses of data and/or meta-data related thereto occurs by randomly cutting off the power supplied to the test target non-volatile memory device while the test target non-volatile memory device performs the write operation. However, unlike the conventional power loss test apparatus, the power loss test apparatus 100 may not randomly cut off the power supplied to the test target non-volatile memory device. In other words, the power loss test apparatus 100 may consider an internal operating state of the test target non-volatile memory device (i.e., may use the current consumption information or the operating state information of the test target non-volatile memory device) when performing the power loss test. Thus, the power loss test apparatus 100 may efficiently perform the power loss test for the test target non-volatile memory device by cutting off the power supplied to the test target non-volatile memory device only during important operations (e.g., a garbage collection operation, etc) of the test target non-volatile memory device. The tester 160 may perform the power loss test for the test target non-volatile memory device based on power supply and power cut-off that are determined by the micro controller 140. For this operation, the tester 160 may continuously perform a write operation using a test algorithm. For example, as illustrated in FIG. 2, the tester 160 may continuously perform the write operation due to the test algorithm during the period between the time when the tester 160 receives the second control signal CTL2(ON) that controls the tester 160 to start the power loss test from the micro controller 140 and the time when the tester 160 receives the second control signal CTL2(OFF) that controls the tester 160 to end the power loss test from the micro controller 140.

In an example embodiment, the power loss test apparatus 100 may consider current consumption of the test target non-volatile memory device. In this case, the test-board 120 may include a current monitoring module and a power control module. The current monitoring module may generate current consumption information INF by monitoring the current consumption of the test target non-volatile memory device inserted into the socket 122-1 through 122-n. The power control module may perform the power supply or the power cut-off through the socket 122-1 through 122-n according to determination of the micro controller 140. That is, when the test-board 120 (i.e., the current monitoring module) provides the current consumption information INF to the micro controller 140 while the micro controller 140 provides the test-board 120 with a first control signal CTL1(ON) that controls the test-board 120 to supply the power to the test target non-volatile memory device, the micro controller 140 may analyze a current consumption pattern of the test target non-volatile memory device based on the current consumption information INF. Here, when the current consumption pattern of the test target non-volatile memory device indicates a power cut-off execution period, the micro controller 140 may provide the test-board 120 with a first control signal CTL1(OFF) that controls the test-board 120 to cut off the power from the test target non-volatile memory device. Thus, the test-board 120 (i.e., the power control module) may cut off the power from the test target non-volatile memory device through the socket 122-1 through 122-n. Based on the power supply and the power cut-off, the power loss test may be repetitively performed for the test target non-volatile memory device during a test period TEST. In some example embodiments, the power cut-off execution period may be determined as a period during which the test target non-volatile memory device performs a garbage collection operation. However, the power cut-off execution period is not limited thereto. For example, the power cut-off execution period may be determined as a period during which the test target non-volatile memory device performs a write operation of the meta-data.

In another example embodiment, the power loss test apparatus 100 may consider a so-called background urgent flag provided by the test target non-volatile memory device. In this case, the test-board 120 may include a state monitoring module and a power control module. The state monitoring module may generate operating state information INF by monitoring at least one state register that indicates whether performing a garbage collection operation is required for the test target non-volatile memory device. For example, the state monitoring module may generate the operating state information INF using the background urgent flag indicated by the state register of the test target non-volatile memory device. In some example embodiments, the state register may be included in the test target non-volatile memory device or in the power loss test apparatus 100. In addition, the power control module may perform the power supply or the power cut-off through the socket 122-1 through 122-n according to determination of the micro controller 140. That is, when the test-board 120 (i.e., the state monitoring module) provides the operating state information INF to the micro controller 140 while the micro controller 140 provides the test-board 120 with a first control signal CTL1(ON) that controls the test-board 120 to supply the power to the test target non-volatile memory device, the micro controller 140 may anticipate (or, determine) a garbage collection period during which the test target non-volatile memory device performs the garbage collection operation based on the operating state information INF. Subsequently, when the micro controller 140 provides the test-board 120 with a first control signal CTL1(OFF) that controls the test-board 120 to cut off the power from the test target non-volatile memory device during the anticipated garbage collection period, the test-board 120 (i.e., the power control module) may cut off the power from the test target non-volatile memory device through the socket 122-1 through 122-n. Based on the power supply and the power cut-off, the power loss test may be repetitively performed for the test target non-volatile memory device during the test period TEST.

In still another example embodiment, the power loss test apparatus 100 may consider both current consumption of the test target non-volatile memory device and a background urgent flag provided by the test target non-volatile memory device. In this case, the test-board 120 may include a current monitoring module, a state monitoring module, and a power control module. The current monitoring module may generate current consumption information INF by monitoring the current consumption of the test target non-volatile memory device inserted into the socket 122-1 through 122-n. The state monitoring module may generate operating state information INF by monitoring at least one state register that indicates whether performing a garbage collection operation is required for the test target non-volatile memory device. The power control module may perform the power supply or the power cut-off through the socket 122-1 through 122-n according to determination of the micro controller 140. That is, the test-board 120 (i.e., the state monitoring module) provides the operating state information INF to the micro controller 140 while the micro controller 140 provides the test-board 120 with a first control signal CTL1(ON) that controls the test-board 120 to supply the power to the test target non-volatile memory device, the micro controller 140 may anticipate a garbage collection period during which the test target non-volatile memory device performs the garbage collection operation based on the operating state information INF. In addition, when the test-board 120 (i.e., the current monitoring module) provides current consumption information INF to the micro controller 140 while the micro controller 140 provides the test-board 120 with a first control signal CTL1(ON) that controls the test-board 120 to supply the power to the test target non-volatile memory device, the micro controller 140 may analyze a current consumption pattern of the test target non-volatile memory device based on the current consumption information INF. Here, when the current consumption pattern of the test target non-volatile memory device indicates a power cut-off execution period during the anticipated garbage collection period, the micro controller 140 may provide the test-board 120 with a first control signal CTL1 (OFF) that controls the test-board 120 to cut off the power from the test target non-volatile memory device. Thus, the test-board 120 (i.e., the power control module) may cut off the power from the test target non-volatile memory device through the socket 122-1 through 122-n. Based on the power supply and the power cut-off, the power loss test may be repetitively performed for the test target non-volatile memory device during the test period TEST.

As described above, the power loss test apparatus 100 may efficiently perform the power loss test by cutting off the power supplied to the test target non-volatile memory device only during important operations (e.g., the garbage collection operation, etc) of the test target non-volatile memory device based on the current consumption information and/or the operating state information of the test target non-volatile memory device. In other words, while the power loss test apparatus 100 controls the tester 160 to perform the write operation using the test algorithm, the power loss test apparatus 100 may control the test-board 120 and the micro controller 140 to perform the power supply and the power cut-off based on the current consumption information and/or the operating state information of the test target non-volatile memory device. Here, when a plurality of test target non-volatile memory devices are inserted into a plurality of sockets 122-1 through 122-n of the test-board 120, the power loss test may be independently (or, separately) performed for respective test target non-volatile memory devices. Thus, a run-time of the power loss test may be reduced and coverage of the power lost test may be enlarged. As a result, productivity of manufacturers and reliability-in use of final products may be improved. In some example embodiments, as illustrated in FIG. 1, the test-board 120 may further include a memory module 123. In this case, when the current consumption information and/or the operating state information of the test target non-volatile memory device are generated, the memory module 123 may store the current consumption information and/or the operating state information of the test target non-volatile memory device. Thus, the test-board 120 may provide the micro controller 140 with the current consumption information and/or the operating state information of the test target non-volatile memory device stored in the memory module 123. Although it is illustrated in FIG. 1 that the micro controller 140 is located outside the test-board 120 and the tester 160, the micro controller 140 may be located inside the test-board 120 or inside the tester 160.

Figure 3:
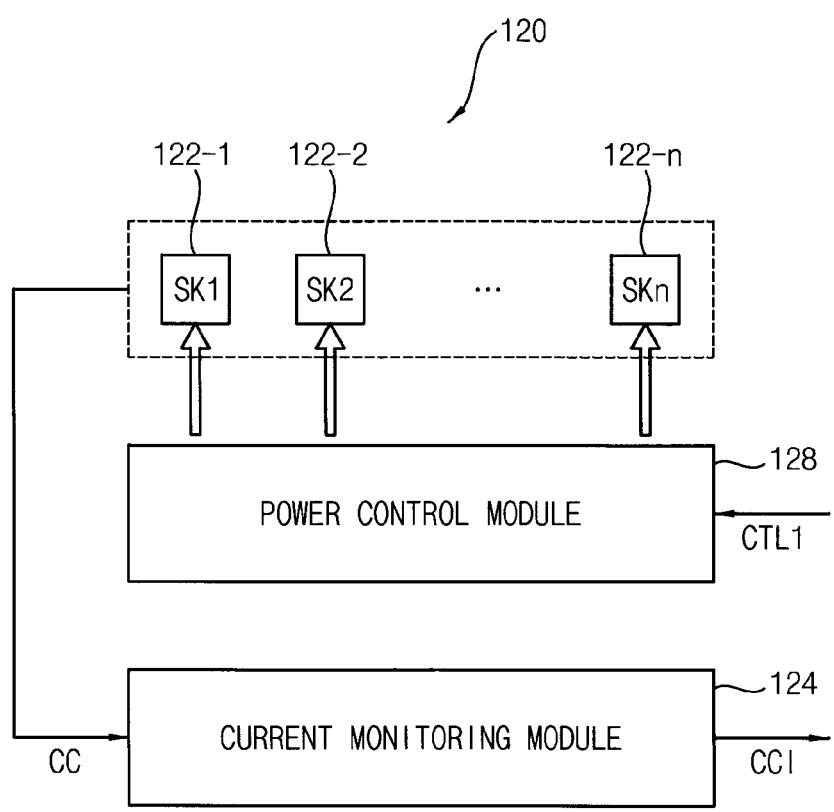
FIG. 3 is a block diagram illustrating an example of a test-board included in the power loss test apparatus of FIG. 1.
Figure 4:
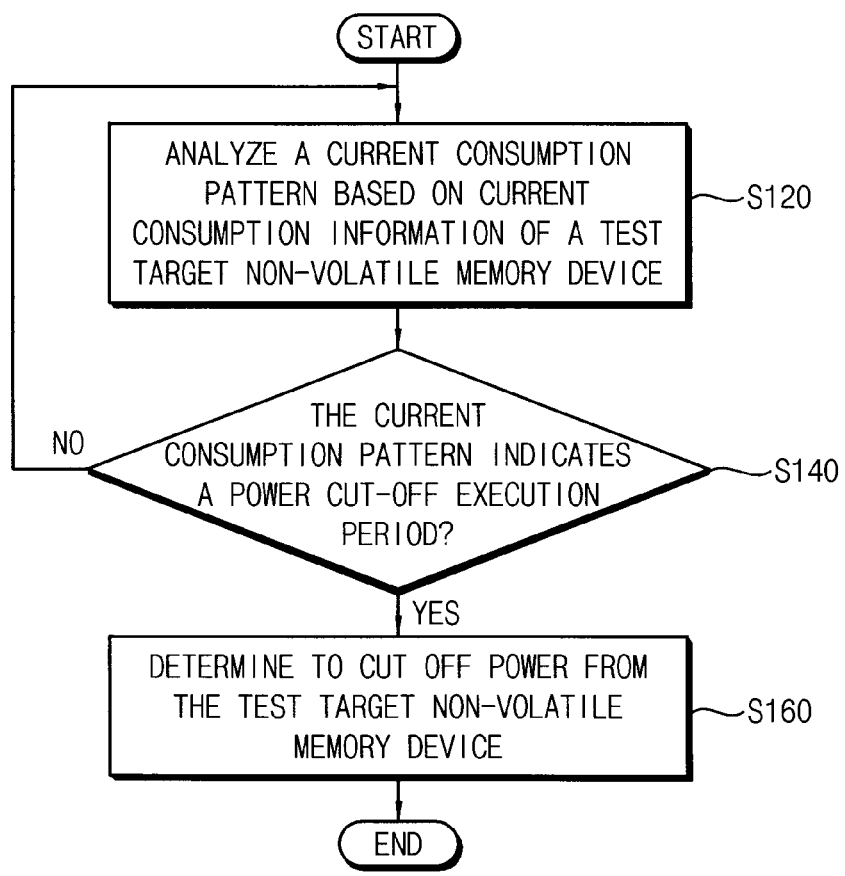
FIG. 4 is a flowchart illustrating an operation of a micro controller that interworks with the test-board of FIG. 3 in the power loss test apparatus of FIG. 1.

FIG. 3 is a block diagram illustrating an example of a test-board included in the power loss test apparatus of FIG. 1. FIG. 4 is a flowchart illustrating an operation of a micro controller that interworks with the test-board of FIG. 3 in the power loss test apparatus of FIG. 1.

Referring to FIGS. 3 and 4, it is illustrated that the power loss test apparatus 100 considers the current consumption of the test target non-volatile memory device when performing the power lost test. In this case, as illustrated in FIG. 3, the test-board 120 may include a current monitoring module 124 and a power control module 128. As described above, the current monitoring module 124 may generate current consumption information CCI by monitoring the current consumption CC of the test target non-volatile memory device inserted into the socket 122-1 through 122-n. For example, the current monitoring module 124 may monitor a current of the socket 122-1 through 122-n and may determine the current consumption CC of the test target non-volatile memory device based on the current of the socket 122-1 through 122-n. Subsequently, the power control module 128 may perform the power supply or the power cut-off through the socket 122-1 through 122-n according to determination of the micro controller 140. That is, according to the determination of the micro controller 140, the power control module 128 may supply the power to the test target non-volatile memory device through the socket 122-1 through 122-n or may cut off the power from the test target non-volatile memory device through the socket 122-1 through 122-n. For this operation, as illustrated in FIG. 4, the micro controller 140 may analyze a current consumption pattern based on the current consumption information CCI of the test target non-volatile memory device (S120) and may check whether the current consumption pattern indicates a power cut-off execution period (S140). Here, when the current consumption pattern indicates the power cut-off execution period, the micro controller 140 may determine to cut off the power from the test target non-volatile memory device (S160). In this case, the micro controller 140 may provide the test-board 120 with a first control signal CTL1 (OFF) that controls the test-board 120 to cut off the power from the test target non-volatile memory device. On the other hand, when the current consumption pattern does not indicate the power cut-off execution period, the micro controller 140 may repeat the above steps S120, S140, and S160.

Typically, the current consumption of the test target non-volatile memory device may differ according to the number of NAND flash memories each processing a write command (i.e., performing a write operation), where the NAND flash memories are included in the test target non-volatile memory device. In addition, the current consumption of the test target non-volatile memory device may differ according to whether a write mode is a multi level cell (MLC) mode or a single level cell (SLC) mode. Meanwhile, it can be determined based on analysis of the current consumption pattern whether the NAND flash memory performs a write operation of data, whether the NAND flash memory performs a write operation of meta-data, whether the NAND flash memory performs a garbage collection operation, etc. Thus, the micro controller 140 may receive the current consumption information CCI from the test-board 120 (i.e., the current monitoring module 124), may analyze the current consumption pattern of the test target non-volatile memory device based on the current consumption information CCI, and may provide the test-board 120 with the first control signal CTL1(OFF) for performing the power cut-off when the current consumption pattern of the test target non-volatile memory device indicates the power cut-off execution period. As the test-board 120 (i.e., the power control module 128) receives the first control signal CTL1(OFF) for performing the power cut-off from the micro controller 140, the test-board 120 may cut off the power from the test target non-volatile memory device through the socket 122-1 through 122-n. In an example embodiment, the micro controller 140 may determine to cut off the power from the test target non-volatile memory device when the current consumption of the test target non-volatile memory device is higher than a predetermined level. In another example embodiment, the micro controller 140 may determine to cut off the power from the test target non-volatile memory device when the current consumption of the test target non-volatile memory device is within a predetermined level-range. In some example embodiments, the power cut-off execution period may be determined as a period during which the test target non-volatile memory device performs a garbage collection operation. However, the power cut-off execution period is not limited thereto. For example, the power cut-off execution period may be determined as a period during which the test target non-volatile memory device performs a write operation of the meta-data.

Figure 5:
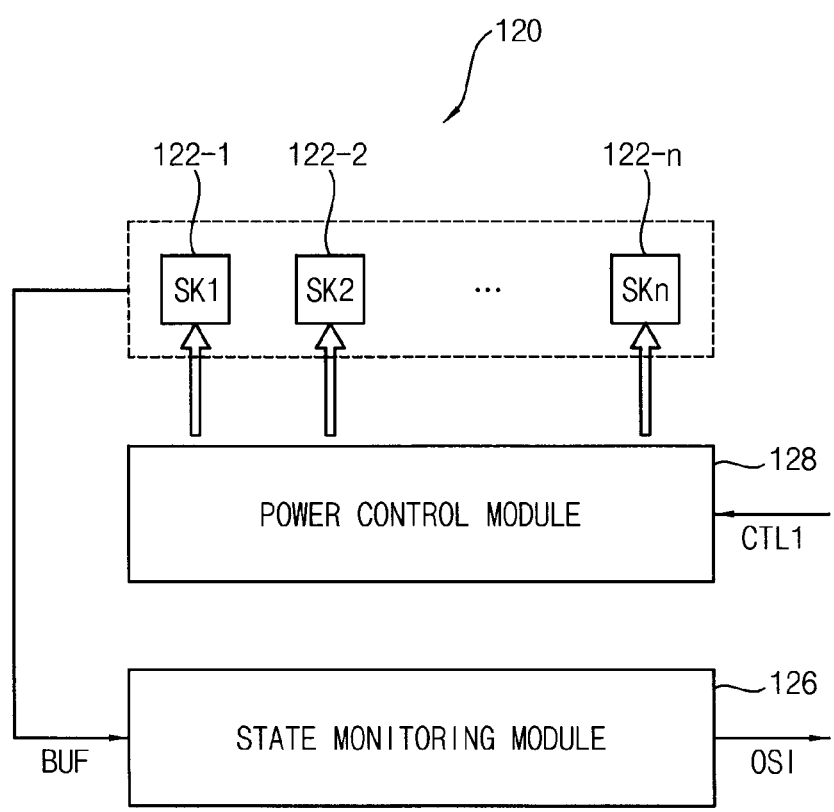
FIG. 5 is a block diagram illustrating another example of a test-board included in the power loss test apparatus of FIG. 1.
Figure 6:
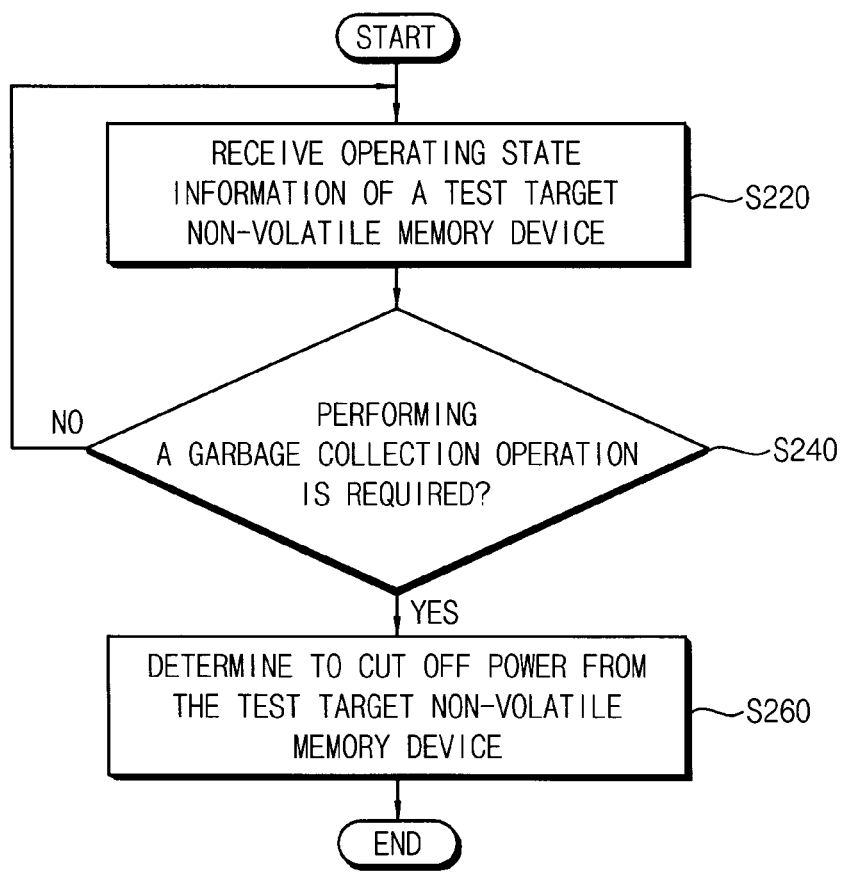
FIG. 6 is a flowchart illustrating an operation of a micro controller that interworks with the test-board of FIG. 5 in the power loss test apparatus of FIG. 1.

FIG. 5 is a block diagram illustrating another example of a test-board included in the power loss test apparatus of FIG. 1. FIG. 6 is a flowchart illustrating an operation of a micro controller that interworks with the test-board of FIG. 5 in the power loss test apparatus of FIG. 1.

Referring to FIGS. 5 and 6, it is illustrated that the power loss test apparatus 100 considers a background urgent flag BUF provided by the test target non-volatile memory device. In this case, as illustrated in FIG. 5, the test-board 120 may include a state monitoring module 126 and a power control module 128. As described above, the state monitoring module 126 may generate operating state information OSI by monitoring at least one state register that indicates whether performing a garbage collection operation is required for the test target non-volatile memory device. For example, the state monitoring module 126 may generate the operating state information OSI using the background urgent flag BUF indicated by the state register of the test target non-volatile memory device. Subsequently, the power control module 128 may perform the power supply or the power cut-off through the socket 122-1 through 122-n according to determination of the micro controller 140. That is, according to the determination of the micro controller 140, the power control module 128 may supply the power to the test target non-volatile memory device through the socket 122-1 through 122-n or may cut off the power from the test target non-volatile memory device through the socket 122-1 through 122-n. For this operation, as illustrated in FIG. 6, the micro controller 140 may receive the operating state information OSI of the test target non-volatile memory device (S220) and may check whether the operating state information OSI indicates that performing the garbage collection operation is required for the test target non-volatile memory device (S240). Here, when the operating state information OSI indicates that performing the garbage collection operation is required for the test target non-volatile memory device, the micro controller 140 may determine to cut off the power from the test target non-volatile memory device (S260). In this case, the micro controller 140 may provide the test-board 120 with a first control signal CTL1(OFF) that controls the test-board 120 to cut off the power from the test target non-volatile memory device. On the other hand, when the operating state information OSI indicates that performing the garbage collection operation is not required for the test target non-volatile memory device, the micro controller 140 may repeat the above steps S220, S240, and S260.

Recently, a non-volatile memory device provides, using an internal state register, an external component (e.g., a host device, etc) with the background urgent flag BUF that indicates whether performing the garbage collection operation is required for the non-volatile memory device. For example, when the background urgent flag BUF is set as 2, performing the garbage collection operation is required immediately for the non-volatile memory device. In addition, when the background urgent flag BUF is set as 1, performing the garbage collection operation will be required in the near future for the non-volatile memory device. Further, when the background urgent flag BUF is set as 0, performing the garbage collection operation will be required after a long time for the non-volatile memory device. Therefore, the micro controller 140 may anticipate (or, determine) a garbage collection period during which the test target non-volatile memory device performs the garbage collection operation if the background urgent flag BUF is set as a nonzero value. Then, the micro controller 140 may provide the test-board 120 with a first control signal CTL1 (OFF) that controls the test-board 120 to cut off the power from the test target non-volatile memory device during the anticipated garbage collection period. Thus, the test-board 120 (i.e., the power control module 128) may cut off the power from the test target non-volatile memory device through the socket 122-1 through 122-n. In example embodiments, the micro controller 140 may differently anticipate the garbage collection period according to how urgent performing the garbage collection operation is (i.e., according to set values of the background urgent flag BUF). For example, when the background urgent flag BUF is set as 2, the micro controller 140 may provide the test-board 120 with the first control signal CTL1(OFF) in a next write operation. In addition, when the background urgent flag BUF is set as 1, the micro controller 140 may provide the test-board 120 with the first control signal CTL1(OFF) after a write operation is performed a number of (or, predetermined) times. Since these are examples, the garbage collection period may be anticipated in various ways.

Figure 7:
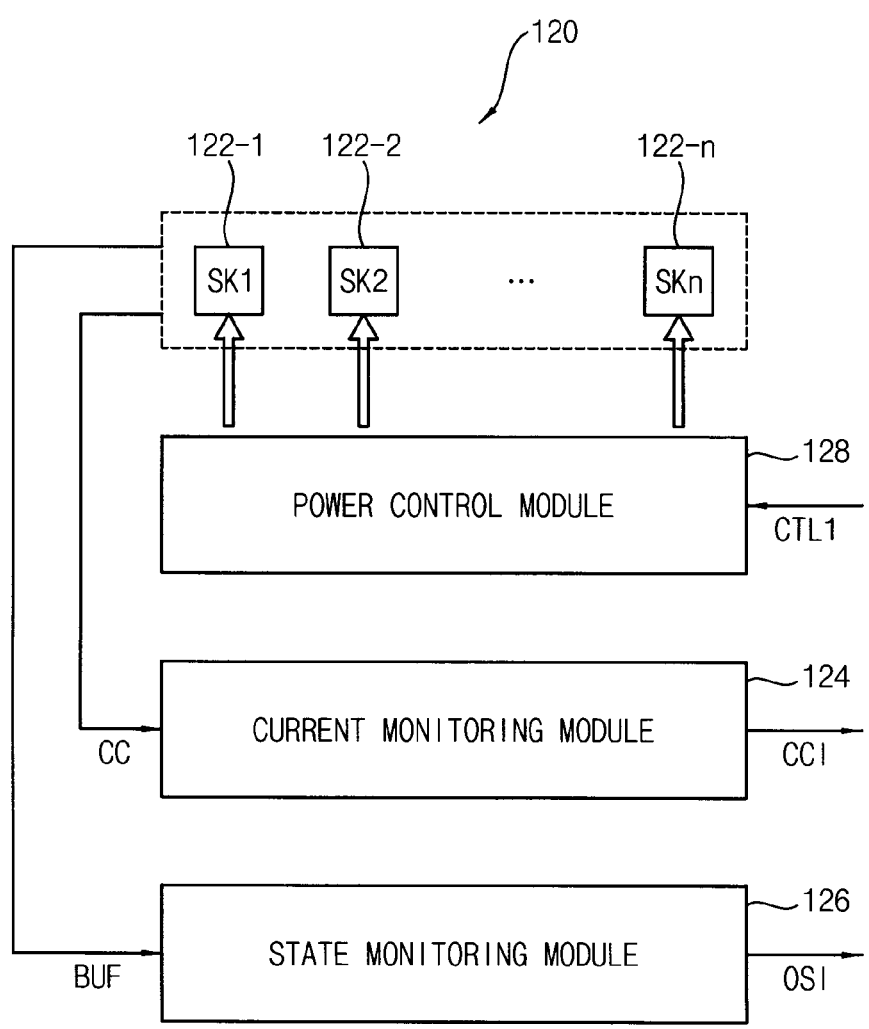
FIG. 7 is a block diagram illustrating still another example of a test-board included in the power loss test apparatus of FIG. 1.
Figure 8:
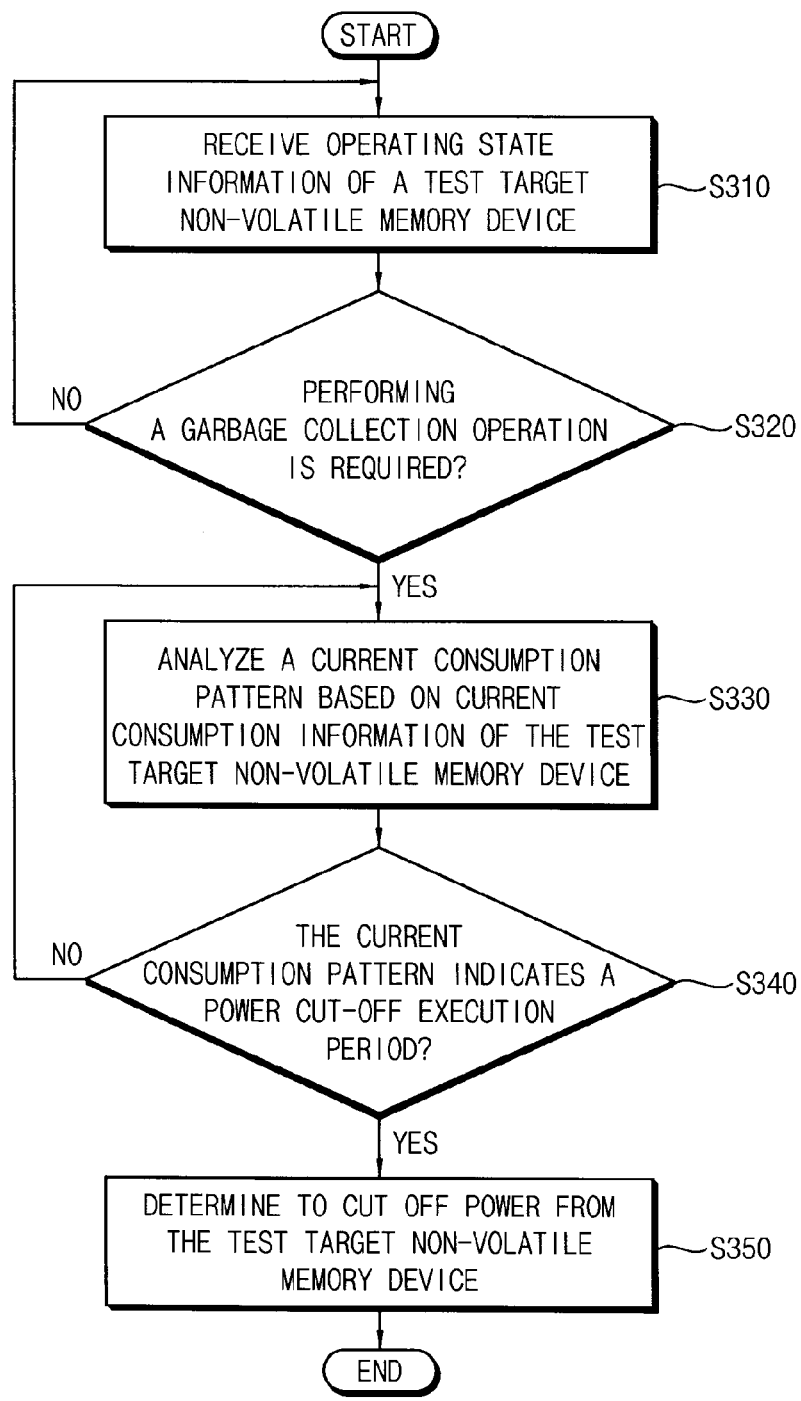
FIG. 8 is a flowchart illustrating an operation of a micro controller that interworks with the test-board of FIG. 7 in the power loss test apparatus of FIG. 1.

FIG. 7 is a block diagram illustrating still another example of a test-board included in the power loss test apparatus of FIG. 1. FIG. 8 is a flowchart illustrating an operation of a micro controller that interworks with the test-board of FIG. 7 in the power loss test apparatus of FIG. 1.

Referring to FIGS. 7 and 8, it is illustrated that the power loss test apparatus 100 considers both the current consumption CC of the test target non-volatile memory device and the background urgent flag BUF provided by the test target non-volatile memory device when performing the power lost test. In this case, as illustrated in FIG. 7, the test-board 120 may include a current monitoring module 124, a state monitoring module 126, and a power control module 128. As described above, the current monitoring module 124 may generate current consumption information CCI by monitoring the current consumption CC of the test target non-volatile memory device inserted into the socket 122-1 through 122-n. In addition, the state monitoring module 126 may generate operating state information OSI by monitoring at least one state register that indicates whether performing a garbage collection operation is required for the test target non-volatile memory device. Subsequently, the power control module 128 may perform the power supply or the power cut-off through the socket 122-1 through 122-n according to determination of the micro controller 140. That is, according to the determination of the micro controller 140, the power control module 128 may supply the power to the test target non-volatile memory device through the socket 122-1 through 122-n or may cut off the power from the test target non-volatile memory device through the socket 122-1 through 122-n. For this operation, as illustrated in FIG. 8, the micro controller 140 may receive the operating state information OSI of the test target non-volatile memory device (S310) and may check whether the operating state information OSI indicates that performing the garbage collection operation is required for the test target non-volatile memory device (S320). Here, when the operating state information OSI indicates that performing the garbage collection operation is required for the test target non-volatile memory device, the micro controller 140 may operate in a power cut-off standby mode. On the other hand, when the operating state information OSI indicates that performing the garbage collection operation is not required for the test target non-volatile memory device, the micro controller 140 may repeat the above steps S310 and S320. Subsequently, while the micro controller 140 operates in the power cut-off standby mode, the micro controller 140 may analyze a current consumption pattern based on the current consumption information CCI of the test target non-volatile memory device (S330) and may check whether the current consumption pattern indicates a power cut-off execution period (S340). Here, when the current consumption pattern indicates the power cut-off execution period, the micro controller 140 may determine to cut off the power from the test target non-volatile memory device (S350). In this case, the micro controller 140 may provide the test-board 120 with a first control signal CTL1(OFF) that controls the test-board 120 to cut off the power from the test target non-volatile memory device. On the other hand, when the current consumption pattern does not indicate the power cut-off execution period, the micro controller 140 may repeat the above steps S330, S340, and S350.

As described above, the power loss test apparatus 100 may efficiently perform the power loss test by cutting off the power supplied to the test target non-volatile memory device only during important operations (e.g., the garbage collection operation, etc) of the test target non-volatile memory device based on both the current consumption information CCI and the operating state information OSI of the test target non-volatile memory device. Although it is described that the power loss test apparatus 100 cuts off the power from the test target non-volatile memory device when the operating state information OSI of the test target non-volatile memory device indicates that performing the garbage collection operation is required and the current consumption information CCI of the test target non-volatile memory device indicates the power cut-off execution period, the present inventive concept is not limited thereto. That is, the power loss test apparatus 100 may consider both the current consumption information CCI and the operating state information OSI of the test target non-volatile memory device in various ways. For example, a criterion by which the power cut-off execution period is determined based on the current consumption pattern may be changed according to how necessary performing the garbage collection operation is. In addition, a criterion by which the power cut-off execution period is determined based on the current consumption pattern and the anticipated garbage collection period may be changed according to how necessary performing the garbage collection operation is. From the above description, those skilled in the art will readily derive various ways that perform the power loss test by cutting off the power from the test target non-volatile memory device only during important operations (e.g., the garbage collection operation, etc) of the test target non-volatile memory device based on both the current consumption information CCI and the operating state information OSI of the test target non-volatile memory device. Therefore, it should be understood that many modifications are possible in the example embodiments without materially departing from the novel teachings and advantages of the present inventive concept.

Figure 9:
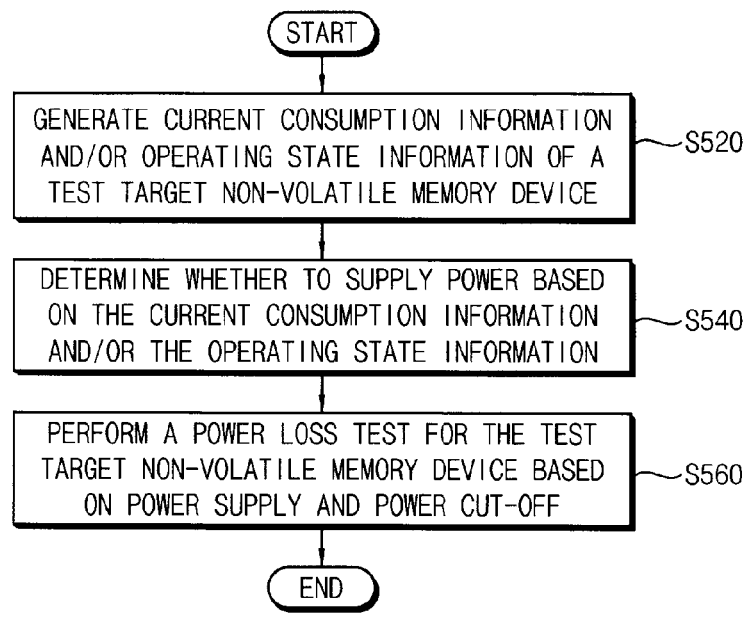
FIG. 9 is a flowchart illustrating a method of performing a power loss test for a non-volatile memory device according to example embodiments.
Figure 10:
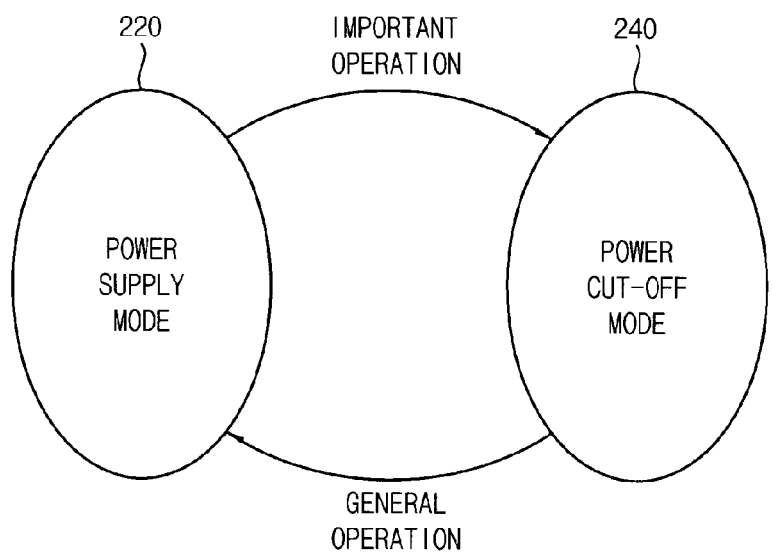
FIG. 10 is a diagram illustrating a power control (i.e., power supply or power cut-off) that is performed by the method of FIG. 9.

FIG. 9 is a flowchart illustrating a method of performing a power loss test for a non-volatile memory device according to example embodiments. FIG. 10 is a diagram illustrating a power control (i.e., power supply or power cut-off) that is performed by the method of FIG. 9.

Referring to FIGS. 9 and 10, the method of FIG. 9 may perform the power loss test for at least one test target non-volatile memory device. A test-board connected to the test target non-volatile memory device may generate current consumption information and/or operating state information of the test target non-volatile memory device (S520). A micro controller determine whether to supply power to the test target non-volatile memory device based on the current consumption information and/or the operating state information of the test target non-volatile memory device (S540). A tester may perform the power loss test for the test target non-volatile memory device based on power supply and power cut-off that are determined by the micro controller (S560). Here, the test target non-volatile memory device may constitute an embedded multi media card. However, the test target non-volatile memory device is not limited thereto. For example, the test target non-volatile memory device may constitute a secure digital card, a compact flash card, a memory stick, an XD picture card, and the like.

Specifically, the method of FIG. 9 may efficiently perform the power loss test by cutting off the power supplied to the test target non-volatile memory device only during important operations (e.g., a garbage collection operation, etc) of the test target non-volatile memory device. As illustrated in FIG. 10, the method of FIG. 9 may switch the test-board between a power supply mode 220 and a power cut-off mode 240 according to whether the test target non-volatile memory device performs important operations. Here, the test-board may supply the power to the test target non-volatile memory device in the power supply mode 220, and the test-board may cut off the power from the test target non-volatile memory device (i.e., may not supply the power to the test target non-volatile memory device) in the power cut-off mode 240. In an example embodiment, the method of FIG. 9 may generate the current consumption information of the test target non-volatile memory device by monitoring current consumption of the test target non-volatile memory device, may analyze a current consumption pattern of the test target non-volatile memory device based on the current consumption information, and may cut off the power from the test target non-volatile memory device when the current consumption pattern indicates a power cut-off execution period. In another example embodiment, the method of FIG. 9 may generate operating state information of the test target non-volatile memory device by monitoring at least one state register that indicates whether performing a garbage collection operation is required for the test target non-volatile memory device, may anticipate (or, determine) a garbage collection period during which the test target non-volatile memory device performs the garbage collection operation based on the operating state information, and may cut off the power from the test target non-volatile memory device during the anticipated garbage collection period. In still another example embodiment, the method of FIG. 9 may generate current consumption information of the test target non-volatile memory device by monitoring current consumption of the test target non-volatile memory device, may generate operating state information of the test target non-volatile memory device by monitoring at least one state register that indicates whether performing a garbage collection operation is required for the test target non-volatile memory device, may anticipate (or, determine) a garbage collection period during which the test target non-volatile memory device performs the garbage collection operation based on the operating state information, and may cut off the power from the test target non-volatile memory device during the anticipated garbage collection period, may analyze a current consumption pattern of the test target non-volatile memory device based on the current consumption information, and may cut off the power from the test target non-volatile memory device when the current consumption pattern indicates a power cut-off execution period during the anticipated garbage collection period. Since these operations are described above, duplicated description will not be repeated. Although a power loss test apparatus for a non-volatile memory device and a method of performing a power loss test for a non-volatile memory device according to example embodiments have been described with reference to FIGS. 1 through 10, those skilled in the art will readily appreciate that many modifications are possible in the example embodiments without materially departing from the novel teachings and advantages of the present inventive concept.

The present inventive concept may be applied to a power loss test for a non-volatile memory device. For example, the present inventive concept may be applied to a power loss test for a multi media card (MMC), an embedded multi media card (eMMC), a secure digital (SD) card, a compact flash (CF) card, a memory stick, an extreme digital (XD) picture card, and the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

THE DESCRIPTION OF THE REFERENCE NUMERALS

100: power loss test apparatus 120: test-board
122: socket 123: memory module
124: current monitoring module 126: state monitoring module
128: power control module 140: micro controller
160: tester

What is claimed is:

1. A power loss test apparatus for a non-volatile memory device comprising:
a test-board including at least one socket into which at least one test target non-volatile memory device is inserted;
a micro controller configured to determine whether to supply power to the test target non-volatile memory device based on current consumption information or operating state information of the test target non-volatile memory device, the current consumption information and the operating state information relating to a background operation of the test target non-volatile memory device including a garbage collection operation; and
a tester configured to perform a power loss test for the test target non-volatile memory device based on whether the power is supplied to the test target non-volatile memory device.

2. The apparatus of claim 1, wherein the test target non-volatile memory device constitutes an embedded multi media card.

3. The apparatus of claim 1, wherein the micro controller is included in the test-board or in the tester.

4. The apparatus of claim 1, wherein the test-board includes:
a current monitoring module configured to monitor current consumption of the test target non-volatile memory device to generate the current consumption information; and
a power control module configured to supply the power to the test target non-volatile memory device through the socket when the micro controller determines to supply the power to the test target non-volatile memory device and configured to cut off the power from the test target non-volatile memory device through the socket when the micro controller determines not to supply the power to the test target non-volatile memory device.

5. The apparatus of claim 4, wherein the micro controller analyzes a current consumption pattern of the test target non-volatile memory device based on the current consumption information, and
wherein the micro controller cuts off the power from the test target non-volatile memory device when the current consumption pattern indicates a power cut-off execution period in which the garbage collection operation is performed.

6. The apparatus of claim 1, wherein the test-board includes:
a register monitoring module configured to monitor at least one state register that indicates whether performing the garbage collection operation is required for the test target non-volatile memory device to generate the operating state information; and
a power control module configured to supply the power to the test target non-volatile memory device through the socket when the micro controller determines to supply the power to the test target non-volatile memory device and configured to cut off the power from the test target non-volatile memory device through the socket when the micro controller determines not to supply the power to the test target non-volatile memory device.

7. The apparatus of claim 6, wherein the micro controller anticipates a garbage collection period during which the test target non-volatile memory device performs the garbage collection operation based on the operating state information, and
wherein the micro controller cuts off the power from the test target non-volatile memory device during the anticipated garbage collection period.

8. The apparatus of claim 1, wherein the test-board includes:

a current monitoring module configured to monitor current consumption of the test target non-volatile memory device to generate the current consumption information;

a register monitoring module configured to monitor at least one state register that indicates whether performing the garbage collection operation is required for the test target non-volatile memory device to generate the operating state information; and a power control module configured to supply the power to the test target non-volatile memory device through the socket when the micro controller determines to supply the power to the test target non-volatile memory device and configured to cut off the power from the test target non-volatile memory device through the socket when the micro controller determines not to supply the power to the test target non-volatile memory device.

9. The apparatus of claim 8, wherein the test-board further includes:

a memory module configured to store the current consumption information and the operating state information.

10. The apparatus of claim 8, wherein the micro controller anticipates a garbage collection period during which the test target non-volatile memory device performs the garbage collection operation based on the operating state information and analyzes a current consumption pattern of the test target non-volatile memory device based on the current consumption information, and wherein the micro controller cuts off the power from the test target non-volatile memory device when the current consumption pattern indicates a power cut-off execution period during the anticipated garbage collection period.

11. A method of performing a power loss test for a non-volatile memory device, the method comprising:

generating, at a test-board connected to at least one test target non-volatile memory device, current consumption information or operating state information of the test target non-volatile memory device, the current consumption information and the operating state information relating to a background operation of the test target non-volatile memory device including a garbage collection operation;

determining, at a micro controller, whether to supply power to the test target non-volatile memory device based on the current consumption information or the operating state information; and performing, at a tester, the power loss test for the test target non-volatile memory device based on whether the power is supplied to the test target non-volatile memory device.

12. The method of claim 11, wherein the test target non-volatile memory device constitutes an embedded multi media card.

13. The method of claim 11, wherein the current consumption information is generated by monitoring current consumption of the test target non-volatile memory device, and a current consumption pattern of the test target non-volatile memory device is analyzed based on the current consumption information, and wherein the power is cut off from the test target non-volatile memory device when the current consumption pattern indicates a power cut-off execution period in which the garbage collection operation is performed.

14. The method of claim 11, wherein the operating state information is generated by monitoring at least one state register that indicates whether performing the garbage collection operation is required for the test target non-volatile memory device, and a garbage collection period during which the test target non-volatile memory device performs the garbage collection operation is anticipated based on the operating state information, and wherein the power is cut off from the test target non-volatile memory device during the anticipated garbage collection period.

15. The method of claim 11, wherein the current consumption information is generated by monitoring current consumption of the test target non-volatile memory device, and the operating state information is generated by monitoring at least one state register that indicates whether performing the garbage collection operation is required for the test target non-volatile memory device, wherein a garbage collection period during which the test target non-volatile memory device performs the garbage collection operation is anticipated based on the operating state information, and a current consumption pattern of the test target non-volatile memory device is analyzed based on the current consumption information, and wherein the power is cut off from the test target non-volatile memory device when the current consumption pattern indicates a power cut-off execution period during the anticipated garbage collection period.

* * * * *